(12) United States Patent
Freiburger

(10) Patent No.: US 6,272,654 B1
(45) Date of Patent: Aug. 7, 2001

(54) FAST SCANNABLE OUTPUT LATCH WITH DOMINO LOGIC INPUT

(75) Inventor: Peter Thomas Freiburger, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/262,797

(22) Filed: Mar. 4, 1999

(51) Int. Cl.[7] .................................................. H04B 17/00
(52) U.S. Cl. ............................................................ 714/724
(58) Field of Search ............................................... 714/724

(56) References Cited

U.S. PATENT DOCUMENTS 5,146,115 * 9/1992 Benhamida ........................... 307/452
5,751,727   5/1998 Martens .
6,108,805 * 8/2000 Rajsuman ............................. 714/724
6,150,869 * 11/2000 Storino et al. ........................ 327/534

* cited by examiner

Primary Examiner—Phung M. Chung
(74) Attorney, Agent, or Firm—Joan Pennington

(57) ABSTRACT

A scannable fast domino output latch is provided. A scannable latch circuit includes a scan logic receiving a scan data input and a scan data clock. The scannable latch circuit includes a transistor stack receiving a data input and receiving a system clock. A first inverter is connected to the transistor stack. The first inverter provides a latch output. A feedback path logic is connected across the first inverter. The feedback path logic is activated responsive to both the system clock and the scan data clock. Improved performance is provided by eliminating the transfer gate and active feedback from the critical path of the scannable latch circuit. The feedback path logic is activated when both the system clock and the scan data clock are low.

12 Claims, 2 Drawing Sheets

FAST SCANNABLE OUTPUT LATCH WITH DOMINO LOGIC INPUT

FIELD OF THE INVENTION

The present invention relates to an improved scannable fast domino output latch.

DESCRIPTION OF THE RELATED ART

FIG. 1 illustrates a conventional latch arrangement. As shown in FIG. 1, the conventional latches are traditionally built with transfer gates feeding cross coupled feedback inverter pairs. In the traditional approach, writing data into the latch can be quite slow due to both getting data through the transfer gate and overcoming the feedback devices. Performance can be improved by the use of larger transfer gates. Also weaker active feedback can be used to provide improved performance. Larger transfer device requires a bigger design and all of the problems that go with the bigger design. Weaker active feedback makes for a less stable storage node.

SUMMARY OF THE INVENTION

A principal object of the present invention is to provide an improved scannable fast domino output latch. Other objects of the invention are to provide a scannable fast domino output latch substantially without negative effects and that overcomes disadvantages of prior art arrangements.

In brief, a scannable fast domino output latch is provided. A scannable latch circuit includes a scan logic receiving a scan data input and a scan data clock. The scannable latch circuit includes a transistor stack receiving a data input and receiving a system clock. A first inverter is connected to the transistor stack. The first inverter provides a latch output. A feedback path logic is connected across the first inverter. The feedback path logic is activated responsive to both the system clock and the scan data clock.

In accordance with features of the invention, improved performance is provided by eliminating the transfer gate and active feedback from the critical path of the scannable latch circuit. The feedback path logic is activated when both the system clock and the scan data clock are low.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
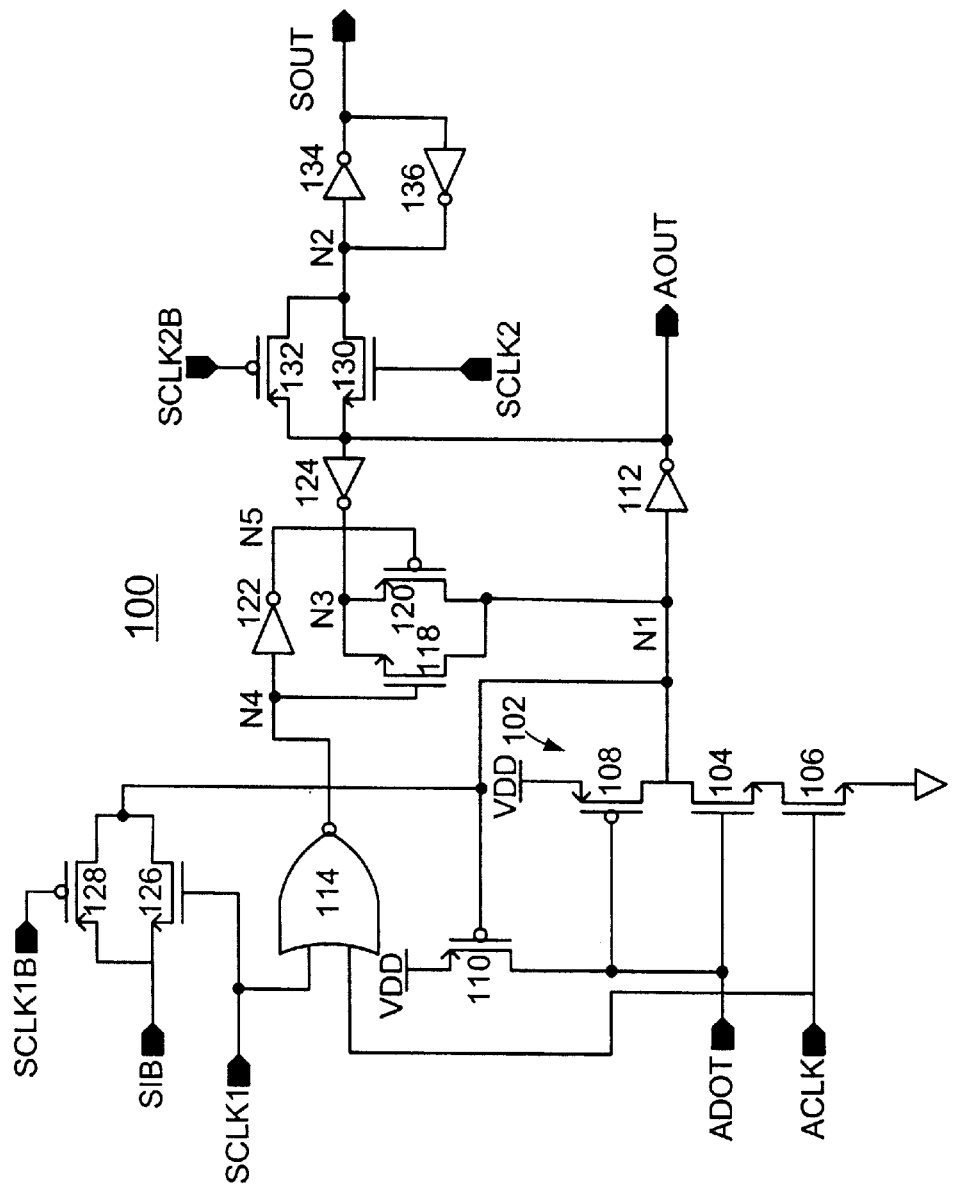
FIG. 2 is a schematic diagram of a scannable fast domino output latch circuit of the preferred embodiment.

Having reference now to the drawings, in FIG. 2 there is shown a scannable fast domino output latch circuit generally designated as 100 including a domino logic input circuit generally designated as 102 embodying the principles of the present invention.

Figure 1:
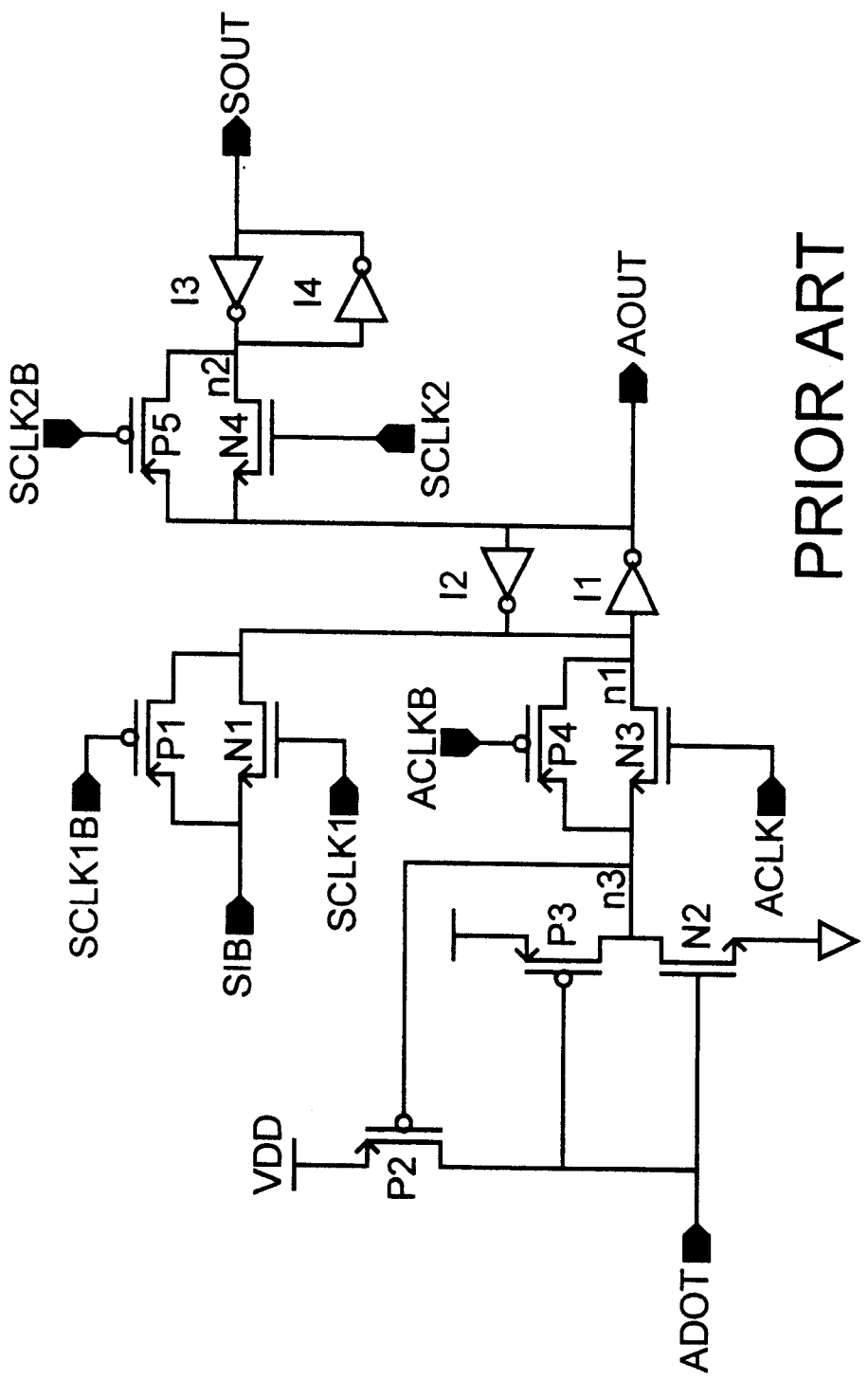
FIG. 1 is a schematic diagram of a conventional latch arrangement.

In accordance with features of the invention, the scannable fast domino output latch 100 is a higher performance alternative to the traditional arrangement as shown in FIG. 1. When the scan clock (SCLK1) is low and the system clock (ACLK) is high, data from data input (ADOT) quickly propagates to the latch output (AOUT). The scannable fast domino output latch circuit 100 provides this improved performance by eliminating the transfer gate and active feedback from the critical path.

Domino logic input circuit 102 includes a first N-channel field effect transistor (NFET) 104 having the data input ADOT applied to its gate. The NFET 104 is connected in a stack between a second NFET 106 connected to ground and a third P-channel field effect transistor (NFET) 108 connected to a supply voltage VDD. The system clock ACLK is applied to the gate of NFET 106. The data input ADOT is applied to the gate of PFET 108. A keeper PFET 110 is connected between the supply voltage VDD and the data input ADOT node. The gate of the keeper PFET 110 is connected to the node N1 data input ADOT gated NFET 104. A first inverter 112 connected at its input to node N1 provides the latch output AOUT at its output. The scan clock SCLK1 and the system clock ACLK are applied to the two inputs of a NOR gate 114.

When both the scan clock SCLK1 is low and the system clock ACLK is low, NOR gate 114 provides a high output to enable a feedback path generally designated by 116 of the preferred embodiment. Feedback path 116 includes an NFET 118, a PFET 120, and a pair of inverters 122 and 124. NFET 118 and PFET 120 are connected between a node N3 and node N1 at the input to inverter 112. The gate of NFET 118 is connected to the output of NOR gate 114 at a node N4. The output of NOR gate 114 at node N4 is connected to the input of inverter 122. The output of inverter 122 at a node N5 is connected to the gate input of PFET 120. Inverter 124 is connected between the latch output AOUT and node N3. NFET 118 and PFET 120 are enabled by the high output of NOR gate 114 to activate the feedback path 116. Otherwise, when either or both the scan clock SCLK1 and the system clock ACLK are high, the feedback path 116 is not activated. When both SCLK1 and ACLK are low the feedback path 116 is activated to hold the current state.

The scannable fast domino output latch 100 includes a pair of scan logic transfer gated transistors including an NFET 126 and a PFET 128. The scan clock SCLK1 is applied to the gate of NFET 126 and scan clock SCLK1B is applied to the gate of PFET 128. NFET 126 and PFET 128 are connected between a scan data input node SIB and the node Ni input to inverter 112. A second pair of scan logic transfer gated transistors includes an NFET 130 and a PFET 132 connected between the latch output node AOUT and a pair of cross coupled inverters 134 and 136. Scan clock SCLK2 is applied to the gate of NFET 130 and scan clock SCLK2B is applied to the gate of PFET 132. The scan port is built in the traditional way since performance is not critical.

While the present invention has been described with reference to the details of the embodiments of the invention shown in the drawing, these details are not intended to limit the scope of the invention as claimed in the appended claims.

What is claimed is:

1. A scannable latch circuit comprising:
   a scan logic receiving a scan data input and a scan data clock;
   a data input;
   a transistor stack receiving said data input and receiving a system clock;
   a first inverter connected to said transistor stack and providing a latch output;
   a feedback path logic connected across said first inverter; said feedback path logic being activated responsive to both said system clock and said scan data clock.

2. The scannable latch circuit as recited in claim 1 wherein said transistor stack receiving said data input and receiving said system clock comprises a Domino logic circuit.

3. The scannable latch circuit as recited in claim 1 wherein said transistor stack receiving said data input and receiving said system clock is connected between a voltage supply and ground and wherein said data input is applied to a gate of an N-channel field effect transistor (NFET) in said transistor stack.

4. The scannable latch circuit as recited in claim 1 wherein said transistor stack receiving said data input and receiving said system clock is connected between a voltage supply and ground and wherein said system clock is applied to a gate of an N-channel field effect transistor (NFET) in said transistor stack.

5. The scannable latch circuit as recited in claim 1 wherein said transistor stack receiving said data input and receiving said system clock is connected between a voltage supply and ground and wherein said data input is applied to a gate of a first N-channel field effect transistor (NFET) in said transistor stack and said system clock is applied to a gate of a second N-channel field effect transistor (NFET) in said transistor stack.

6. The scannable latch circuit as recited in claim 5 includes a keeper transistor connected between said voltage supply and said gate of a first N-channel field effect transistor (NFET) in said transistor stack.

7. The scannable latch circuit as recited in claim 1 includes a NOR gate receiving inputs of said system clock and said scan clock and providing an output to activate said feedback path logic.

8. The scannable latch circuit as recited in claim 7 wherein said feedback path logic includes an N-channel field effect transistor (NFET) and a P-channel field effect transistor (PFET) and a pair of inverters; said NOR gate output applied to a gate of said NFET and said NOR gate output inverted by a first one of said pair of inverters and applied to a gate of said FFET; said NFET and said PFET connected between an output of a second one of said pair of inverters and an input to said first inverter; and an input of said second one of said pair of inverters connected to said latch output of said first inverter.

9. The scannable latch circuit as recited in claim 1 wherein said feedback path logic is activated responsive to both said system clock and said scan clock being low.

10. A scannable latch circuit comprising:
   a scan logic receiving a scan data input and a scan data clock;
   a data input;
   a Domino logic transistor stack receiving said data input and receiving a system clock;
   a first inverter connected to said transistor stack and providing a latch output;
   a feedback path logic connected across said first inverter; said feedback path logic being activated responsive to both said system clock and said scan data clock.

11. The scannable latch circuit as recited in claim 10 includes a NOR gate receiving inputs of both said system clock and said scan data clock and said NOR gate providing an output for activating said feedback path logic.

12. The scannable latch circuit as recited in claim 10 wherein said feedback path logic includes a pair of transistors gated by said NOR gate output.

\* \* \* \* \*